United States Patent [19]

Underwood

[11] Patent Number: 4,818,894
[45] Date of Patent: Apr. 4, 1989

[54] METHOD AND APPARATUS FOR OBTAINING HIGH FREQUENCY RESOLUTION OF A LOW FREQUENCY SIGNAL

[75] Inventor: George D. Underwood, Inglewood, Calif.

[73] Assignee: Hughes Aircraft Company, Los Angeles, Calif.

[21] Appl. No.: 23,502

[22] Filed: Mar. 9, 1987

[51] Int. Cl.[4] .................. H03L 7/00; H03B 19/00; H03K 7/00
[52] U.S. Cl. .................................. 307/269; 307/529; 328/63; 328/73; 328/163
[58] Field of Search .................. 307/269, 529; 328/63, 328/73, 162, 163, 164; 375/122; 381/31

[56] References Cited

U.S. PATENT DOCUMENTS

| | | | |
|---|---|---|---|
| 3,509,472 | 11/1967 | Arlen | 307/269 |
| 3,564,427 | 8/1969 | Uchida | 328/63 |
| 3,896,388 | 7/1975 | Hatsukano et al. | 307/269 |
| 3,946,255 | 3/1976 | Stein | 307/269 |
| 4,303,803 | 12/1981 | Yatsuzuka | 381/31 |
| 4,540,945 | 9/1985 | Kuroki | 307/269 |
| 4,561,021 | 12/1985 | Abe | 328/63 |
| 4,656,649 | 4/1987 | Takahashi | 307/269 |

FOREIGN PATENT DOCUMENTS 0224614  10/1986  Japan ............................. 307/529

Primary Examiner—Stanley D. Miller
Assistant Examiner—Huy K. Mai
Attorney, Agent, or Firm—Leonard A. Alkov; A. W. Karambelas

[57] ABSTRACT

A method and apparatus for obtaining high frequency resolution of a low frequency data signal are provided. The invention comprises a low frequency select logic 27 for generating the data signal having low frequency resolution, low frequency state machine logic 29 for determining whether the data signal is resolved to predetermined high frequency resolution characteristics and circuitry for generating a correction signal to modify the data signal to high frequency resolution, and high frequency logic 17 for modifying the data signal in response to the low frequency correction signal. The high frequency logic 17 operates to selectively modify the path of low frequency data in response to the correction signal to modify the low frequency data signal to obtain high frequency resolution.

12 Claims, 11 Drawing Sheets

FIG. 5b

| | OUTPUTS | | | | | INPUTS | | |
|---|---|---|---|---|---|---|---|---|
| | PWLOWSEL | PWHIGHSEL | DURLOWSEL | DURHIGHSEL | | PWLSB | DURLSB | 2STATE |
| | o o o o o o o — | o — o — o — — o | o o o o o o — — | o o — — o o o o | | o — o — o — o — | o o — — o o — — | o o o o — — — — |

METHOD AND APPARATUS FOR OBTAINING HIGH FREQUENCY RESOLUTION OF A LOW FREQUENCY SIGNAL

BACKGROUND OF THE INVENTION

The present invention relates to resolution of data signals and, more particularly, to a method and apparatus for increasing data resolution without the need for communicating high resolution signals throughout a circuit.

Contemporary information systems operate to process large amounts of information in relatively short periods. In order to facilitate that processing the system must operate at high speeds with the various circuit components coordinated to cooperatively transfer data at those speeds. For example, a high frequency sampling circuit requires high frequency clock pulses and high resolution control signals to facilitate sampling of information with each clock pulse. Control signals may be communicated to various types of processing circuitry, e.g. circuitry that performs the sampling or circuitry that operates on the sampled information to sum that information, average the information, etc. Consequently the individual circuits must be constructed, and the data, control and clock signals synchronized to be communicated to the various circuit portions at the correct time in order to permit the proper flow of information through the circuit.

Difficulties with respect to synchronizing the arrival of data, control and clock signals to the various circuit components become particularly acute as the speed of the system and the complexity of the system increase. For example, where a high frequency clock signal has to be communicated to each device of a synchronous system, delays inherent in passing the signal through device package pins, module connector pins, sockets, printed wiring board traces, connective cabling, semiconductor devices, and other circuit elements cause the clock pulses to arrive at different devices in the communication network out of sync (this is known as clock skew). Consequently, the potential resolution obtainable by the system based on system clock frequency is inherently limited by propagation delays, clock skew and other characteristics of the system. In some instances such characteristic limitations may cause the particular circuit portions to fail to process the data as required. For example, where the correct high frequency clock pulse does not arrive at a particular circuit portion in the required window to register a high frequency data signal, data will be input into the circuit component on the wrong clock edge thereby skewing the data by one clock period. In high frequency systems minor signal propagation delay variances due to temperature variances, device process variances, physical manufacturing tolerances, etc. become significant. Such variances can cause uncertainty as to which clock edge will register critical data signals. This uncertainty results in incorrect information transfer as well as jitter, both of which degrade system performance to an unacceptable level.

Contemporary circuits communicate the high frequency clock and control signals throughout the various circuit portions in order to obtain high frequency resolution of the data. Difficulties arise with respect to the operation of contemporary systems in that the short period of the high frequency clock signal enhances the possibility that, as a result of clock skew, propagation delays and other factors, the clock and control signals may arrive at a device out of sync. Though contemporary systems attempt to correct for such synchronization difficulties, the delay elements and other devices used to implement such corrective steps (themselves having characteristic delay uncertainty or variance) are frequently inadequate to provide the desired degree of reliability and remain limited by the short periods of the high frequency clock signal.

Accordingly, it is desirable to provide a device for transferring data that permits high resolution of the data without the need to synchronize high frequency signals, to minimize potential loss of data attributable to clock skew, propagation delays and the like.

It is further desirable to provide a high resolution data transfer system that utilizes lower frequency signals to communicate the data and to obtain the desired resolution.

It is further desirable to provide a high resolution system wherein the desired degree of resolution may be varied in accordance with the needs of a particular application, while utilizing common low frequency signals in circuit portions requiring lower resolution.

It is further desirable to provide a high resolution system that requires lower power dissipation and less high frequency logic to obtain a desired degree of resolution.

These and other objects and advantages of the present invention are described below in connection with the embodiment described below.

SUMMARY OF THE INVENTION

A method and apparatus for obtaining high frequency resolution of a low frequency data signal are provided. The invention comprises a low frequency signal generator for generating the data signal having low frequency resolution, low frequency logic for determining whether the data signal is resolved to predetermined high frequency resolution characteristics, circuitry for generating a correction signal to modify the data signal to high frequency resolution, and high frequency logic for modifying the data signal in response to the low frequency correction signal. The high frequency logic operates to selectively modify the path of low frequency data in response to the correction signal to modify the low frequency data signal to high frequency resolution.

In the presently preferred embodiment the width and/or duration of the low frequency data signal are resolved to one high frequency clock period at the high frequency logic.

BRIEF DESCRIPTION OF THE DRAWINGS

FIG. 5(b) is a truth table illustrating exemplary combinational logic that may be incorporated into the state machine logic set forth in FIG. 5(a);

DETAILED DESCRIPTION OF THE PREFERRED EMBODIMENT

The detailed description set forth below in connection with the appended drawings is intended merely as a description of the presently preferred embodiment of the invention, and is not intended to represent the only form in which the present invention may be constructed or utilized. The description sets forth functions and steps for utilizing the invention in connection with the illustrated embodiment. It is to be understood, however, that the same or equivalent constructions and applications may be accomplished by different embodiments that are also intended to be encompassed within the spirit and scope of the invention.

Figure 1:
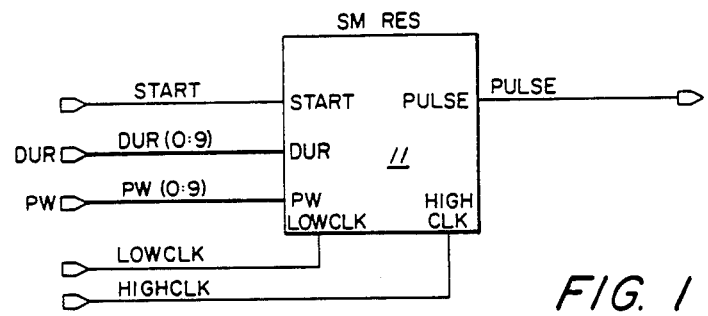
FIG. 1 is a block diagram of a top level view of the state machine constructed in accordance with the present invention.

FIG. 1 illustrates the high level block diagram of the exemplary embodiment of the present invention. As shown at FIG. 1 state machine 11 is operative to generate a high resolution output signal PULSE. As described below the PULSE signal is generated in response to receipt of a low resolution signal, PULSE LOW, and one or more low resolution correction signals, e.g. HIGHSEL. The construction of state machine 11 is described in more detail below. In general, state machine 11 operates to generate a low frequency correction signal, identified as HIGHSEL, representative of the desired degree of offset to be applied to the PULSE LOW signal communicated to a high frequency logic circuit. In practice, the high frequency logic circuit may be any of a variety of different types of circuits for processing data such as a data sampling circuit adapted to sample the input data stream at predetermined increments of time.

By means of the accompanying correction signal(s) the low resolution data being communicated to the high frequency logic can be offset to provide higher resolution than would be available by means of the low frequency signal alone. The correction signal(s) may be formatted in various ways to include information regarding the desired offset, duration, pulse width or other information relative to controlling the manner in which the data is processed in the high frequency logic. It is also anticipated that the high frequency logic may be formed to vary the degree of correction of a single parameter in response to the characteristics of the correction signal.

The correction signal(s) may be coded in any of a variety of formats that may be decoded by the high frequency logic. For example, the HIGHSEL correction signal may include information regarding the number of high frequency clock periods that the low frequency data signal, PULSE LOW, is to be offset in order to obtain a desired resolution. In the presently preferred embodiment the HIGHSEL signal is coded to indicate whether or not the PULSE LOW signal is to be offset by a single high frequency clock period. However, it is anticipated that the HIGHSEL correction signal may be coded, e.g. by a multiple pulse sequence, to regulate the offset to any desired number of high frequency clock periods. In another embodiment multiple HIGHSEL correction signals may be generated to further regulate the output signal characteristics.

Information relevant to the desired pulse resolution is input to the state machine 11. In the presently preferred embodiment the input information determines the start time, as well as the designated width and duration of the output signal, PULSE. The pulse width and duration information is evaluated, e.g. to determine whether the designated duration and width are equivalent to an even or odd number of high frequency clock pulses, and that information is combined with information concerning the low frequency pulse duration and width, to derive a correction signal, HIGHSEL. The correction signal indicates whether the low frequency signal is to be modified at the destination circuit by one high frequency clock period. It is anticipated that additional input signals may be communicated to the state machine 11 and used to define the characteristics of the low frequency data signal, PULSE LOW, and/or the low frequency correction signal(s), HIGHSEL, in order to communicate the desired data signal to the high frequency logic circuitry.

As described in more detail below the present invention provides low frequency signals that may be readily communicated to various circuit components to facilitate higher resolution operation of those components. The high clock signal may be generated at or communicated to the various circuit components and utilized to correct the low frequency data signal to the desired resolution, responsive to the information contained in the pulse signal. Higher resolution of the data processing may, therefore, be effected without the need to communicate high frequency signals between circuit components. Accordingly, the high frequency logic may be localized. The low frequency correction signal may be readily communicated to the various circuit components well in advance of the time that the correction is to take place. Thus, difficulties and loss of data arising from the receipt of unsynchronized high frequency data and high frequency clock pulses, out of sync, at different circuit components, are alleviated.

Figure 2:
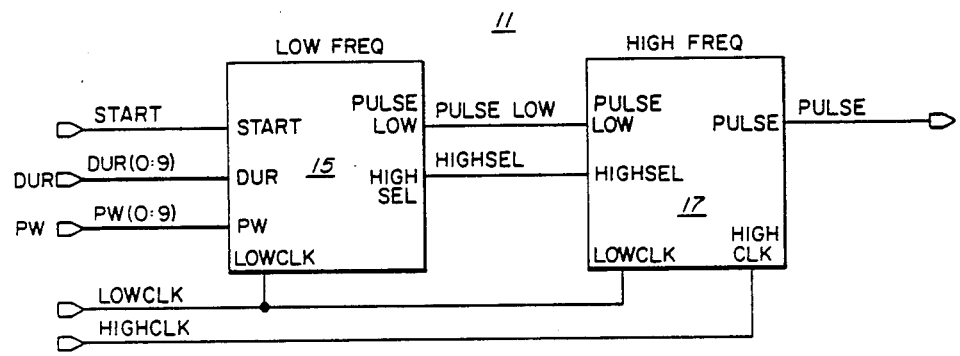
FIG. 2 is a lower level block diagram further illustrating the state machine set forth in FIG. 1.

FIG. 2 provides a slightly more detailed view of the state machine 11 set forth generally at FIG. 1. As illustrated at FIG. 2 the state machine 11 comprises low frequency logic circuit 15 and high frequency logic circuit 17. The high frequency logic circuit may be disposed at the location where the higher resolution is required. As described more fully below state machine 11 includes low frequency logic circuitry used to generate control signals PULSE LOW and HIGHSEL responsive to the desired pulse characteristics of the output signal, PULSE, e.g. pulse, width and pulse duration. The high frequency logic circuit 17 is principally directed to offsetting the low frequency signal by one or more; HIGHCLK clock periods to produce the output PULSE signal. It is to be understood, however, that in other embodiments the logic circuit 17 may operate to perform different or additional modifications of the PULSE LOW signal.

Figure 3:
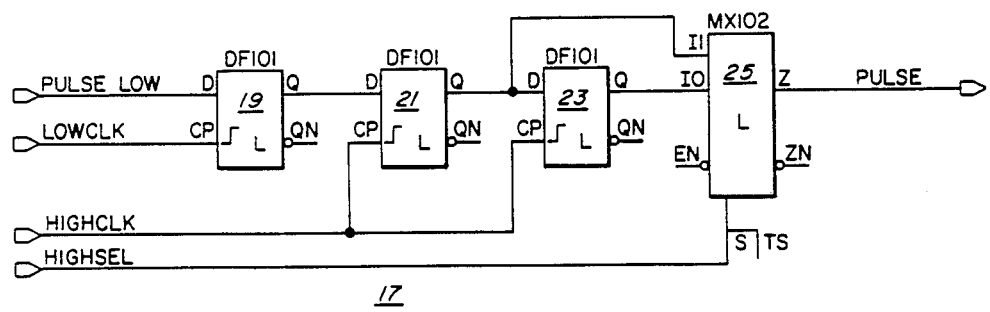
FIG. 3 is a block diagram of the high frequency select logic illustrated generally at FIG. 2.

FIG. 3 illustrates a portion of the circuitry contained in high frequency logic circuit 17. The PULSE LOW and HIGHSEL input signals input to logic circuit 17 originate from low frequency logic circuit 15, in response to the processing of the designated pulse duration and pulse width information by the low frequency logic. The low frequency clock signal, LOWCLK is communicated to both low frequency logic circuit 15 and high frequency logic circuit 17. The high frequency clock signal, HIGHCLK, need only be communicated to the high frequency logic circuit 17.

In the presently preferred embodiment high frequency logic circuit 17 operates to selectively introduce a delay to provide greater resolution of the low frequency data signal, PULSE LOW. The low frequency signal PULSE LOW passes through registers 19 and 21, which collectively delay the LOWCLK signal by the equivalent of three high frequency clock periods (i.e. one LOWCLK period plus one HIGHCLK period). The output from register 21 is communicated to both register 23 and multiplexer 25. Where the multiplexer 25 selects the I0 input, the signal from register 21 is not immediately passed through the multiplexer 25, but is delayed by one HIGHCLK period necessary to pass the signal from register 21 through register 23. Thus, by selecting the I0 or I1 input to multiplexer 25 the pulse signal may be selectively delayed by one additional high frequency clock pulse period. In an alternate embodiment (not shown) the output of register 19 may also be directly communicated to multiplexer 25 so that the PULSE signal may be modified by two clock periods.

Figure 4:
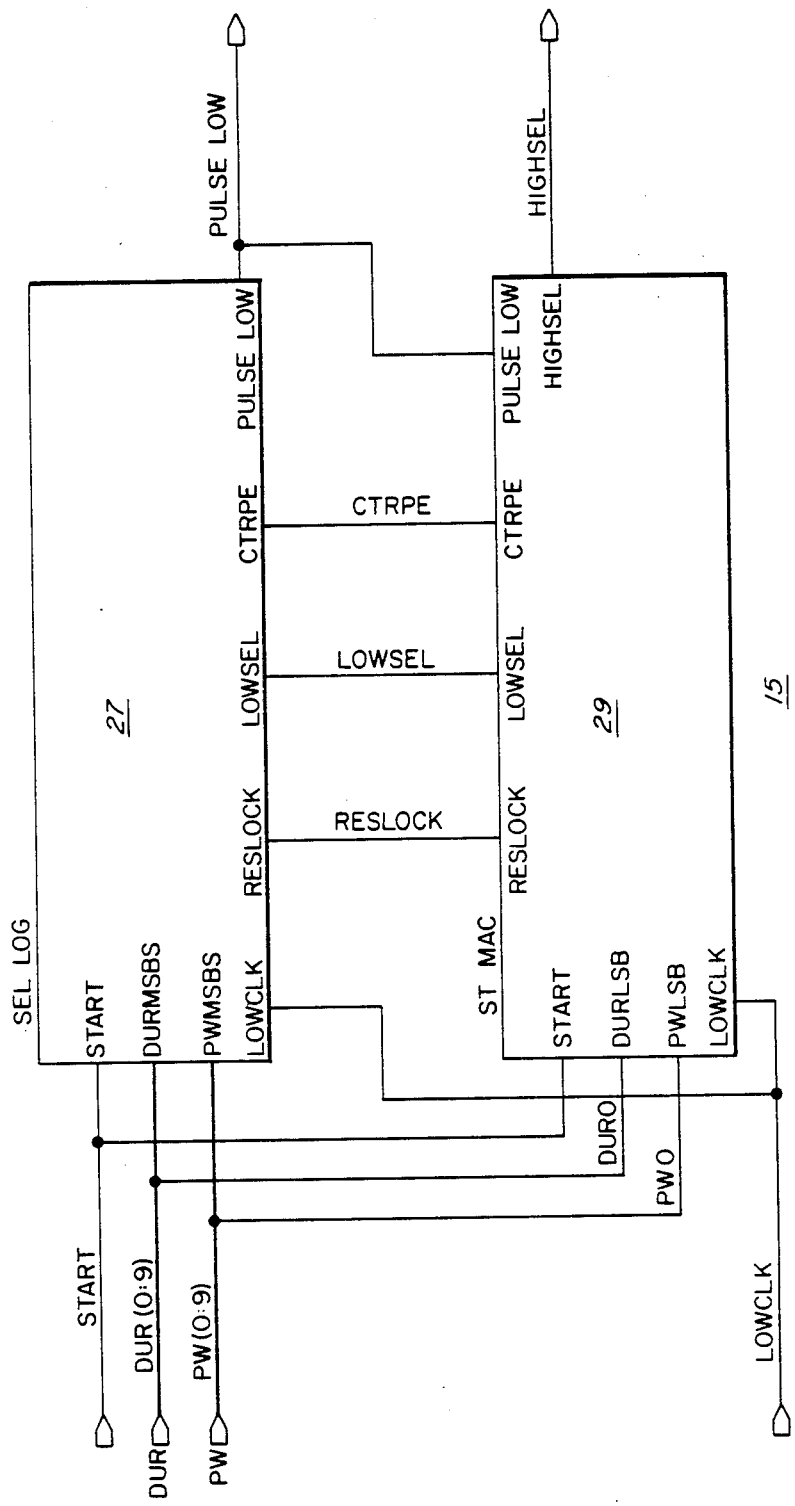
FIG. 4 is a block diagram of the low frequency logic illustrated generally at FIG. 2.

FIG. 4 illustrates components of the low frequency logic circuit 15, illustrated more generally at FIG. 2. As shown at FIG. 4 the low frequency logic circuit 15 comprises select logic 27, operative to generate the PULSE LOW signal, and state machine logic 29, operative to generate the correction signal, HIGHSEL. The signals resolution lock (RESLOCK), low select (LOWSEL), and counter parallel enable (CTRPE) are communicated between logic 27 and 29 to facilitate the generation of PULSE LOW and HIGHSEL signals communicated to high frequency logic circuit 17.

Figure 5A:
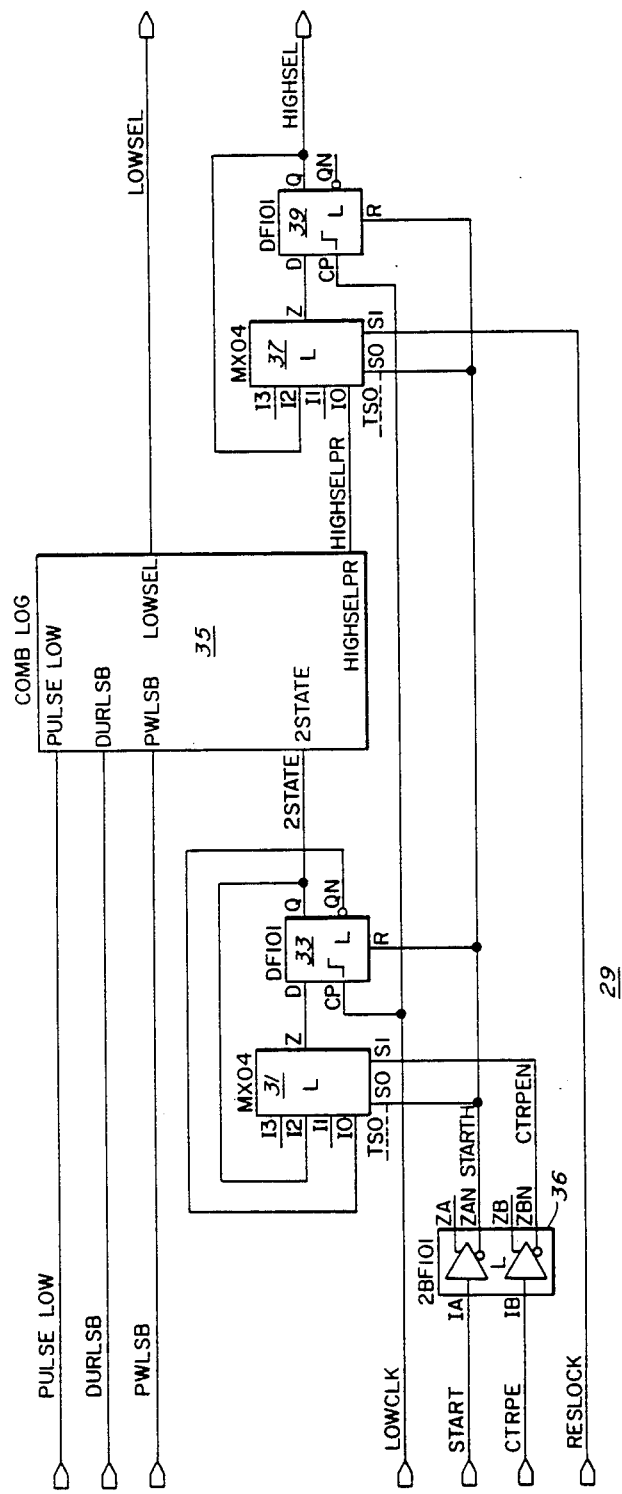
FIG. 5(a) is a block diagram further illustrating the state machine logic illustrated generally at FIG. 4.

FIG. 5(a) further details the state machine logic 29 illustrated more generally at FIG. 4. The state machine logic 29 includes multiplexers 31, 37, registers 33, 39, combinational logic 35 and inverter buffers 36. The precise combinational logic implemented within combinational logic 35 may vary in accordance with the desired information to be communicated to the high frequency logic circuit 17. In the presently preferred embodiment the combinational logic utilized within combinational logic 35 is represented by the truth table set forth at FIG. 5(b). It is to be understood, however, that various other logic schemes may be implemented within the scope of the present invention, as described above.

Figure 6:
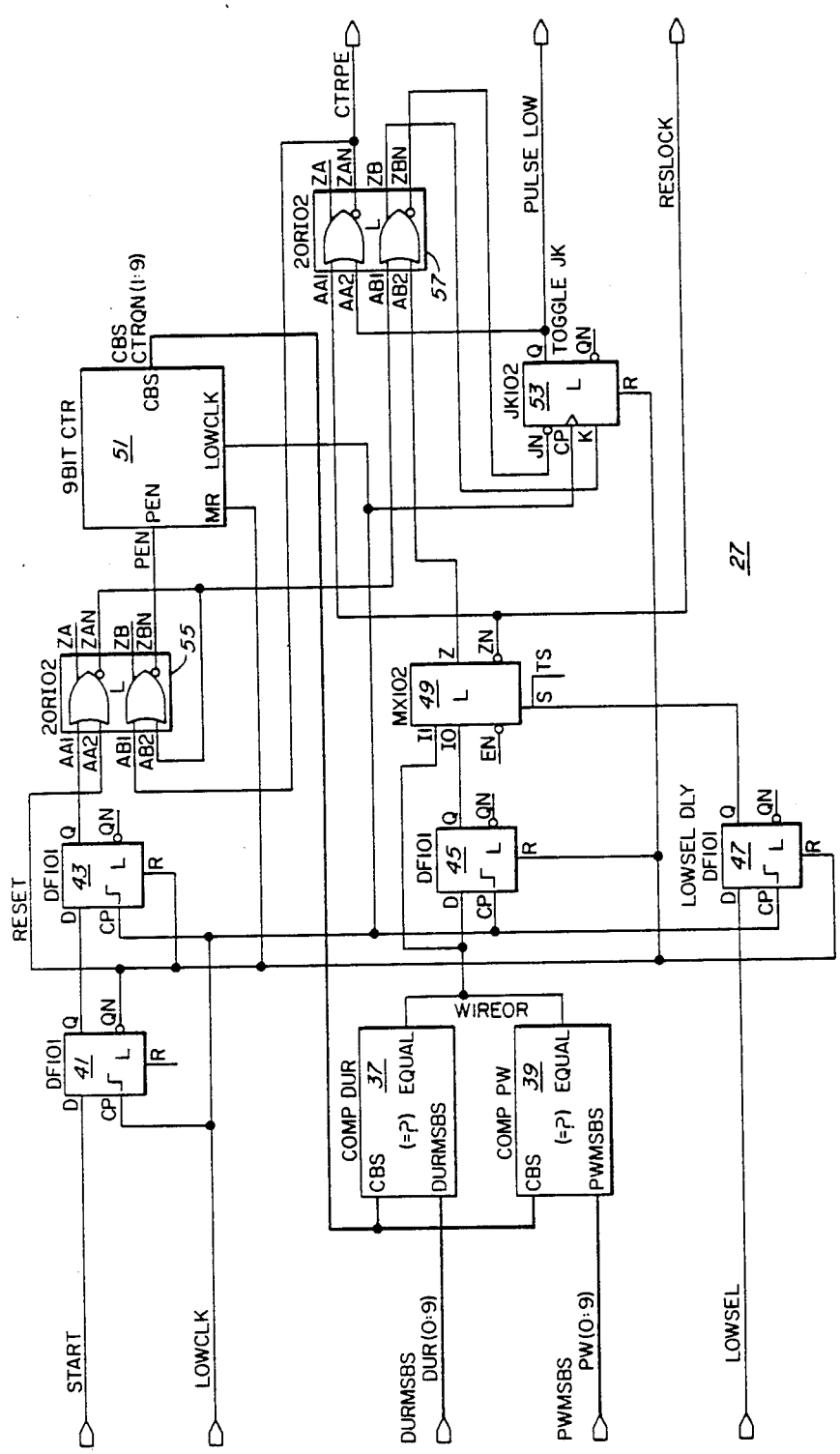
FIG. 6 is a block diagram further illustrating the low frequency select logic set illustrated generally at FIG. 4.

FIG. 6 illustrates an exemplary implementation of low frequency select logic 27, illustrated more generally at FIG. 4. Comparators 37 and 39 function to programmably set the desired duration and pulse width of the signal PULSE LOW, to be communicated to the high frequency logic 17. In the presently preferred embodiment comparators 37 and 39 may be set to values represented by a 10 bit binary number (two's compliment format) i.e. up to $2^{10}-1=1023$ decimal, thereby defining characteristics of the PULSE LOW signal. However, as previously indicated, other values may be implemented, or other determinates added to provide additional or different definition of the PULSE LOW signal.

Registers or flip flops 41, 43, 45, 47, multiplexer 49, counter 51, flip flop 53 and logic 55 and 57 function to generate signals useful to define PULSE LOW, and HIGHSEL. It is to be understood that the precise circuitry of select logic 27 may be varied in accordance with the desired characteristics of the PULSE LOW and HIGHSEL signals.

FIGS. 7-18 illustrate timing signals communicated throughout the circuit in order to resolve the pulse width or pulse duration of the PULSE output signals.

Figure 7:
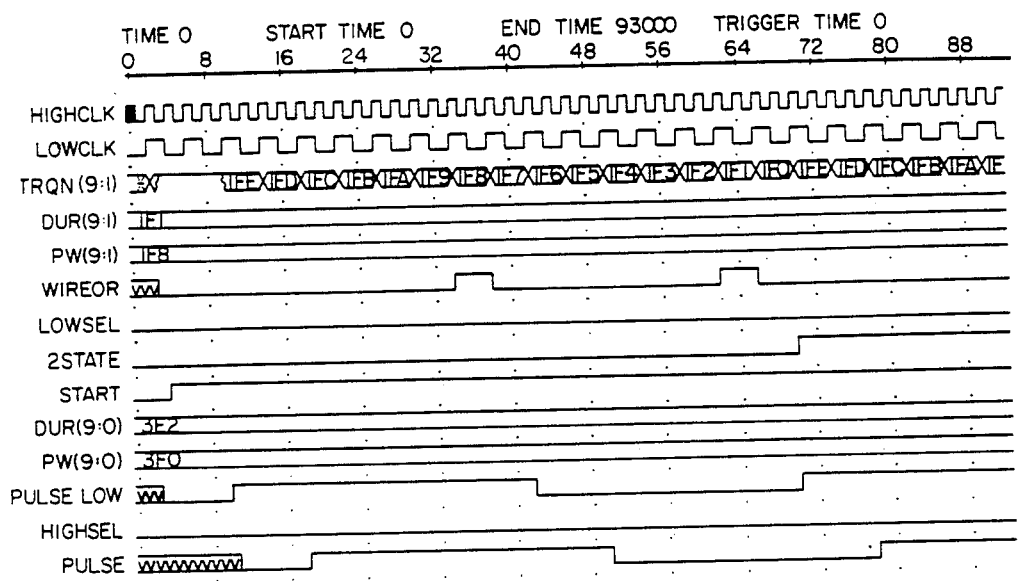
FIGS. 7-18 are timing diagrams representative of exemplary operation of the present invention.
Figure 8:
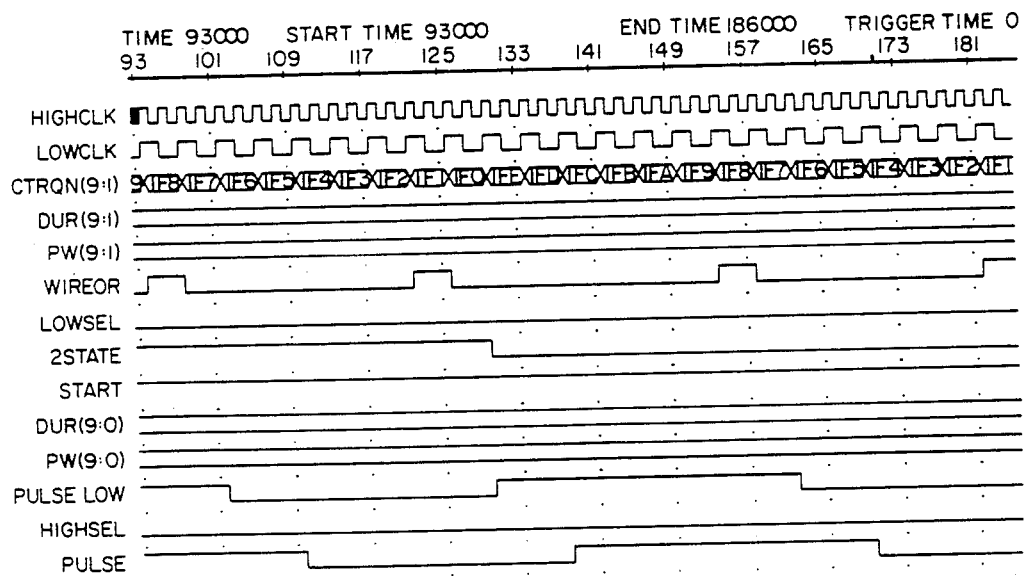
Figure 9:
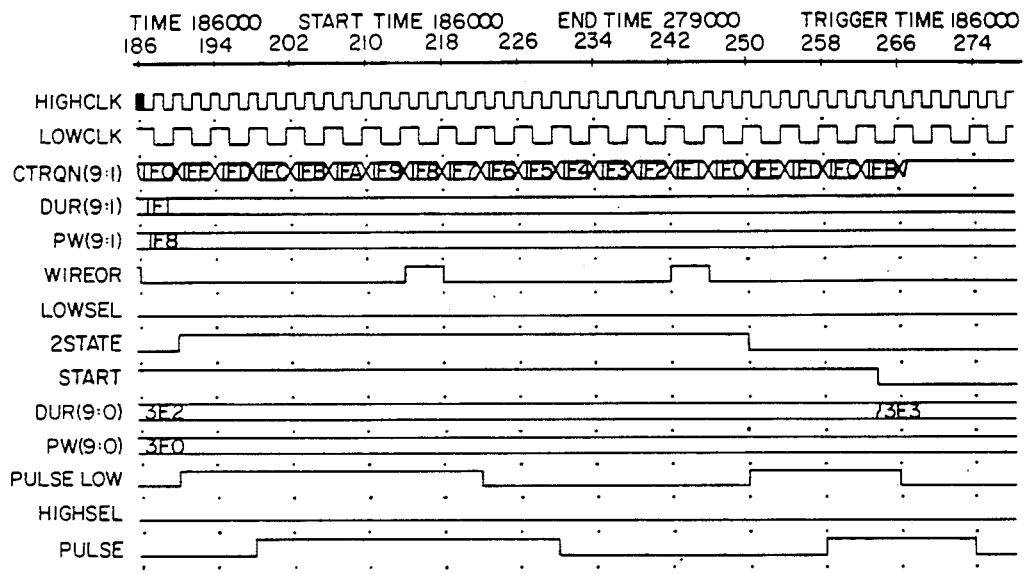

FIGS. 7-9 illustrate signals generated in the exemplary embodiment wherein the PULSE signal is intended to have an even pulse width and an even pulse duration, i.e. where pulse width is 16 and pulse duration is 30. This represents the simplest scenario in which no correction is needed. The output signal PULSE follows the PULSE LOW signal, trailing by four high frequency clock periods. HIGHSEL and LOWSEL remain zero.

Figure 10:
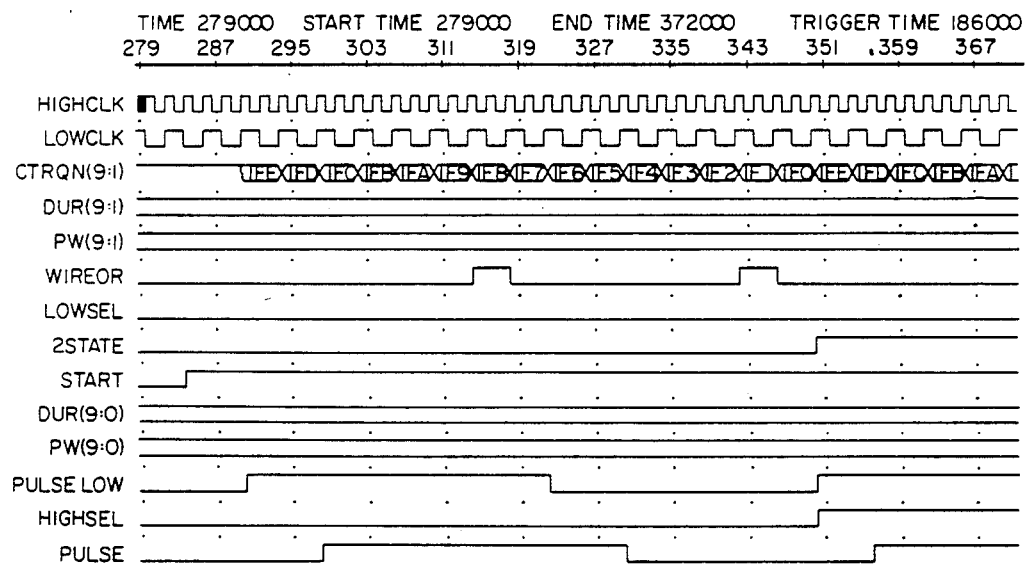
Figure 11:
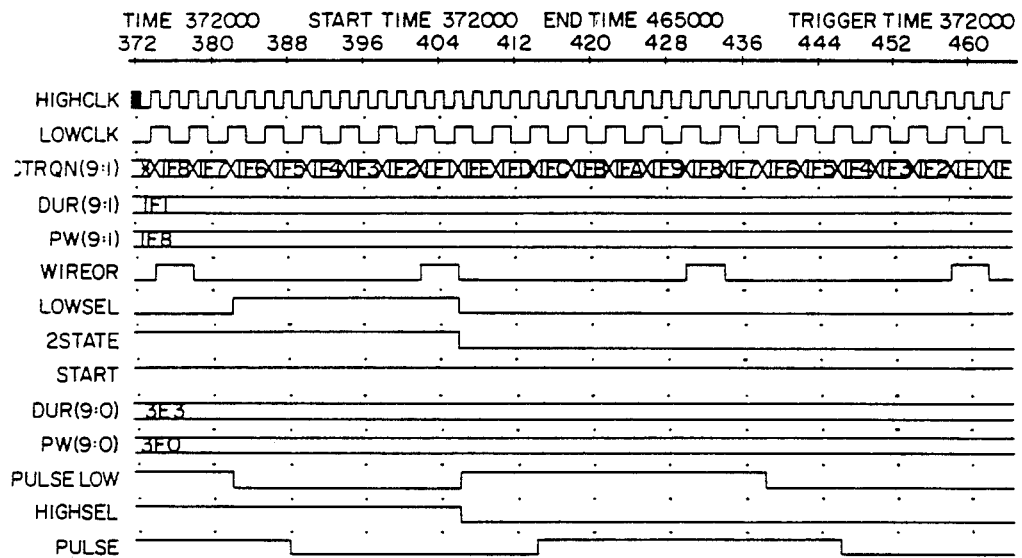
Figure 12:
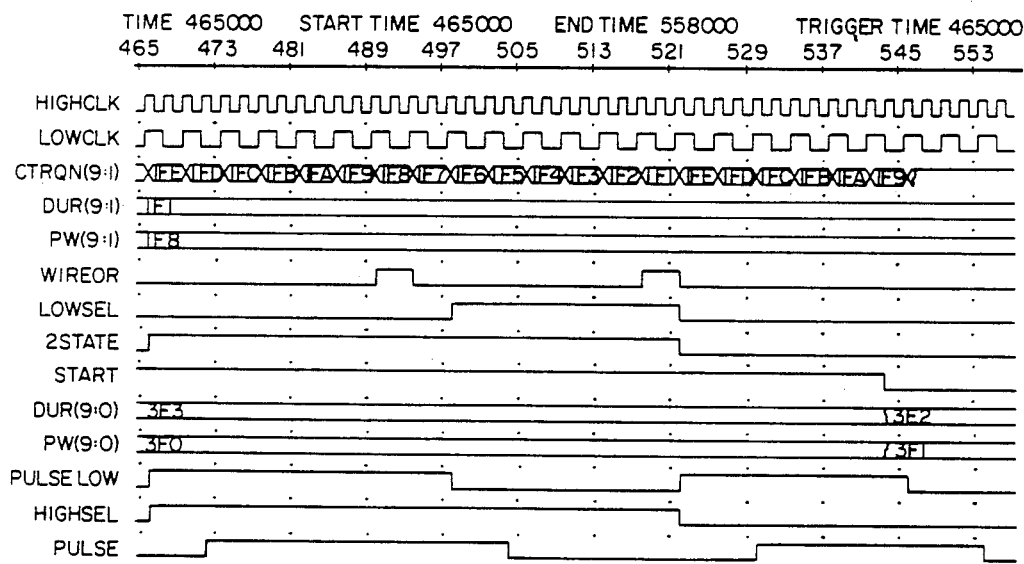

FIGS. 10-12 illustrate signal patterns generated where the PULSE signal is intended to have an even pulse width, but an odd pulse duration, i.e. pulse width equals 16 and pulse duration equals 29. In this scenario HIGHSEL changes in a dynamic manner correcting the PULSE LOW signal as necessary to the higher resolution PULSE signal.

Figure 13:
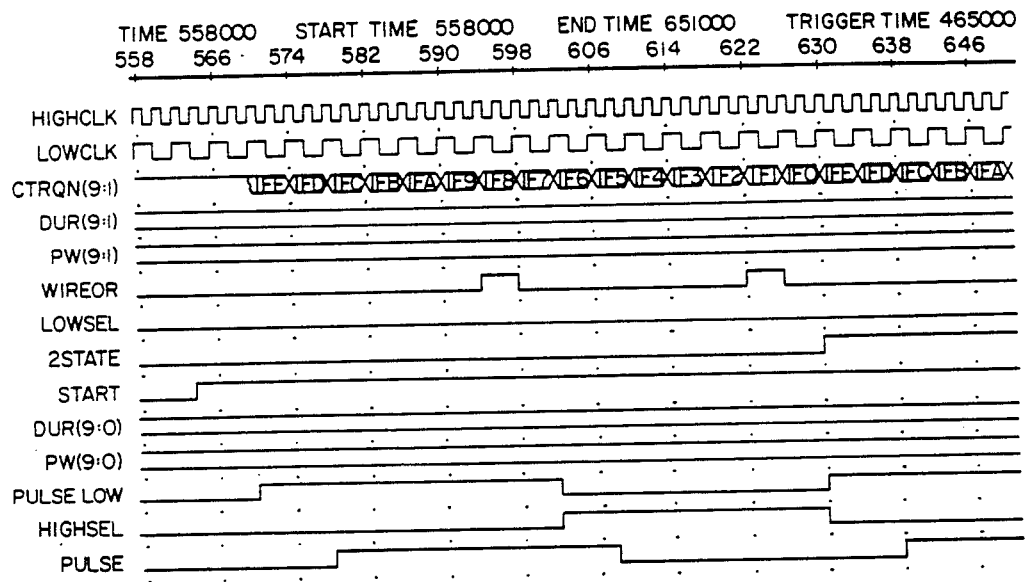
Figure 14:
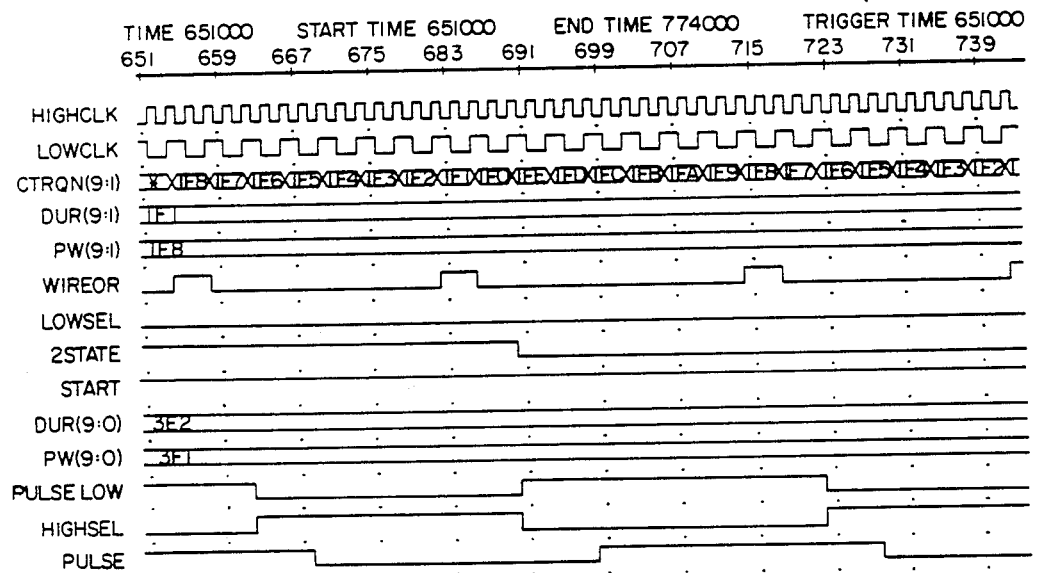
Figure 15:
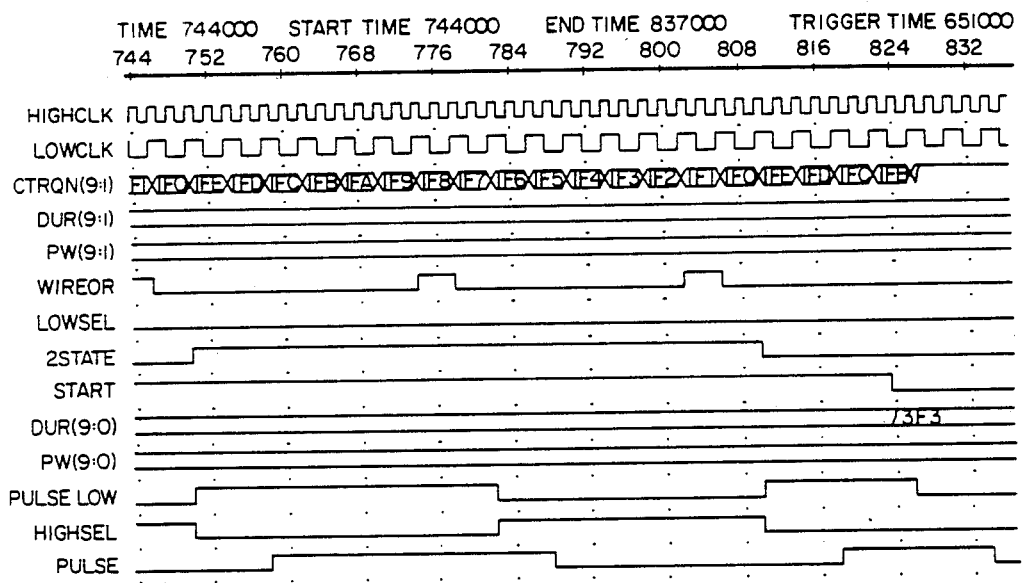

FIGS. 13-15 illustrate signal patterns generated in a scenario wherein the PULSE signal is intended to have an odd pulse width and an even pulse duration, i.e. pulse width equals 15 and pulse duration equals 30. Again the PULSE signal differs from the PULSE LOW signal in response to the HIGHSEL signal going to one.

Figure 16:
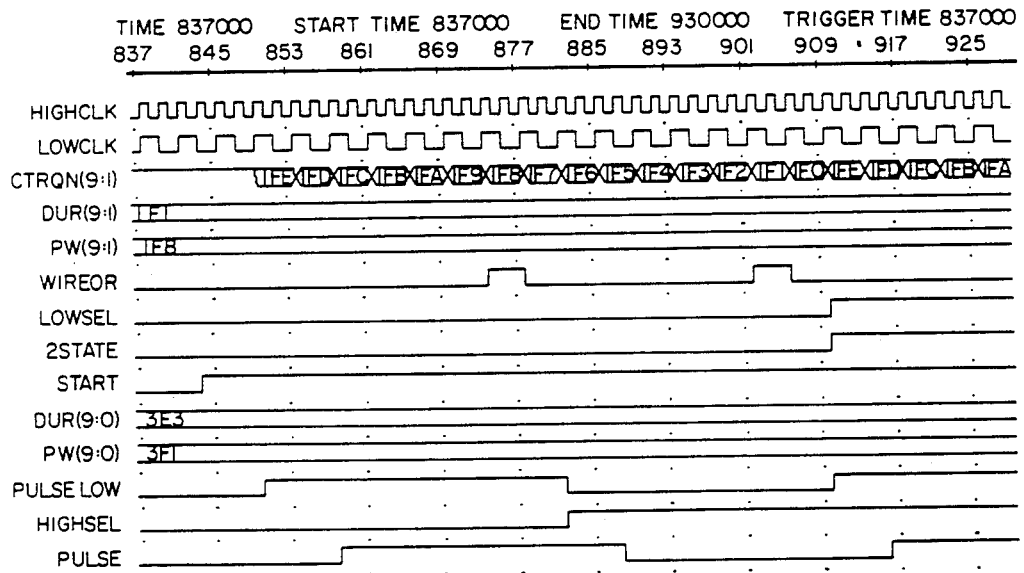
Figure 17:
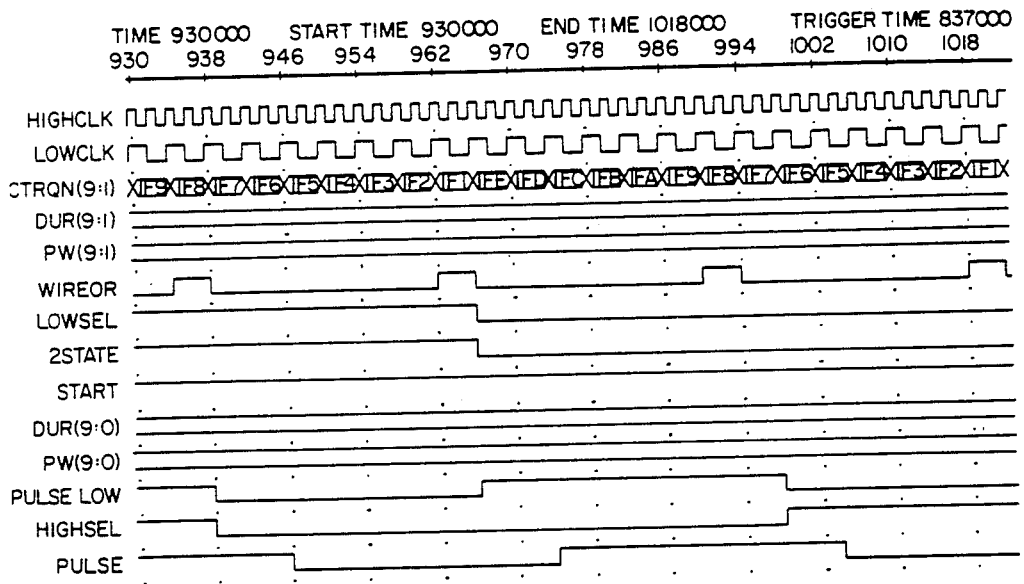
Figure 18:
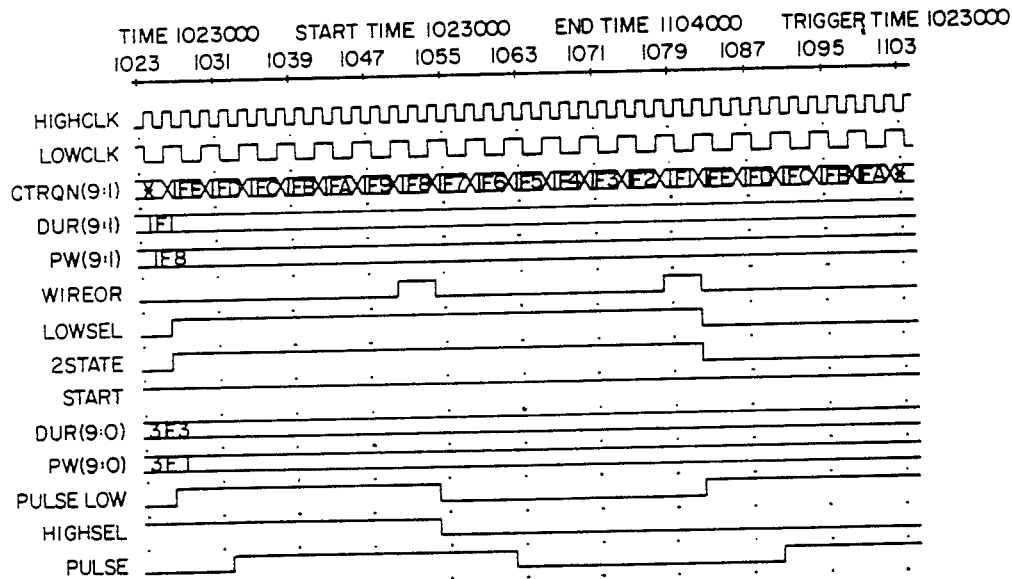

FIGS. 16-18 illustrate the signal patterns in a scenario wherein the PULSE signal is intended to have an odd pulse width and an odd pulse duration, i.e. pulse width equals 15 and pulse duration equals 29. The HIGHSEL correction signal again causes deletion of one high frequency clock period when required.

As described above, the foregoing description represents only the presently preferred embodiment of the invention. Various modifications, additions and substitutions may be made to the invention without departing from the spirit or scope of the invention. For example the HIGHCLK signal may have a frequency three or four times greater than the LOWCLK signal, or more. Moreover, the HIGHSEL correction signal may function to delete or add a larger number of high frequency clock periods from the PULSE LOW signal, with information relating to the number of periods to be deleted or added encoded in the correction signal. Accordingly, the above description is not intended to exclude other equivalent constructions that incorporate the broader aspects of the present invention.

What is claimed is:

1. A method of increasing the resolution of a low frequency data signal comprising:
   generating a data wave signal having low frequency resolution;
   determining the desired high frequency resolution of the data wave form;
   generating a low frequency correction signal with a low frequency clock, said correction signal being indicative of the modification of the data signal necessary to obtain the determined high frequency resolution;
   communicating the data signal and the correction signal to high frequency logic; and
   correcting the data signal to the determined higher frequency resolution at the high frequency logic.

2. The method as recited in claim 1 wherein the step of correcting the low frequency data signal comprises selectively modifying the path of the low frequency data signal through the high frequency logic in response to the correction signal.

3. The method as recited in claim 2 wherein the step of selectively modifying the low frequency data signal comprises the step of selectively passing the low frequency data signal through a variable number of registers, each of the registers having a delay period associated therewith.

4. The method as recited in claim 1 wherein the step of modifying the low frequency data signal comprises modifying the data signal by one high frequency clock period.

5. The method as recited in claim 1 wherein said step of generating a correction signal comprises determining whether the width and duration of the low frequency data signal are resolved to predetermined characteristics.

6. The method as recited in claim 1 wherein the step of generating a low frequency correction signal comprises:
   receiving information concerning desired resolution of the low frequency data signal; and
   combining the received information with a low frequency clock signal to generate the low frequency correction signal.

7. The process of obtaining high frequency resolution of a low frequency data signal comprising:
   communicating a low frequency data signal to a high frequency processing circuit;
   communicating a high frequency clock signal to the processing circuit;
   communicating a low frequency correction signal to the processing circuit, said correction signal being representative of the modification of the data signal necessary to obtain high frequency resolution of the data signal; and
   selectively modifying the low frequency data signal at the processing circuit in response to the correction signal to obtain the desired resolution of the data signal.

8. A circuit for obtaining high frequency resolution of a low frequency data signal comprising:
   a low frequency signal generator for generating a low frequency data signal;
   low frequency logic for determining whether low frequency data signal is resolved to predetermined high frequency resolution characteristics and for generating a low frequency correction signal responsive to the correction necessary to resolve the low frequency data signal to the predetermined high frequency resolution characteristics; and
   high frequency logic for modifying said low frequency data signal in response to said low frequency correction signal to obtain high frequency resolution.

9. The circuit as recited in claim 8 wherein said high frequency logic comprises a low frequency data signal path, and circuitry for selectively modifying said low frequency data signal path to generate a corrected low frequency data signal.

10. The circuit as recited in claim 8 wherein said low frequency data signal path through said high frequency logic is modified in response to said low frequency correction signal.

11. The circuit as recited in claim 8 wherein said high frequency logic corrects the duration of said low frequency data signal by one high frequency clock period.

12. The circuit as recited in claim 8 wherein said high frequency logic corrects the pulse width of said low frequency data signal by one high frequency clock period.

* * * * *